(12) United States Patent
Aw

(10) Patent No.: US 9,595,823 B2
(45) Date of Patent: Mar. 14, 2017

(54) LOW POWER CIRCUIT FOR TRANSISTOR ELECTRICAL OVERSTRESS PROTECTION IN HIGH VOLTAGE APPLICATIONS

(71) Applicant: Intel Corporation, Santa Clara, CA (US)

(72) Inventor: Chee Hong Aw, Klang (MY)

(73) Assignee: Intel Corporation, Santa Clara, CA (US)

( * ) Notice: Subject to any disclaimer, the term of this patent is extended or adjusted under 35 U.S.C. 154(b) by 385 days.

(21) Appl. No.: 14/163,806

(22) Filed: Jan. 24, 2014

(65) Prior Publication Data

US 2015/0214723 A1 Jul. 30, 2015

(51) Int. Cl.
*H02H 1/00* (2006.01)
*H02H 9/04* (2006.01)
*H02H 3/20* (2006.01)

(52) U.S. Cl.
CPC .................................. *H02H 3/20* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,126,596 A | * | 6/1992 | Millman | .......... H03K 19/01721 326/113 |
| 5,677,641 A | * | 10/1997 | Nishio | ............. H03K 19/01852 326/121 |
| 5,751,525 A | * | 5/1998 | Olney | .................. G01R 31/002 361/111 |
| 5,880,620 A | * | 3/1999 | Gitlin | ..................... G11C 5/146 327/388 |
| 5,894,227 A | * | 4/1999 | Acuff | ................. H03K 19/0013 326/113 |
| 6,366,482 B1 | * | 4/2002 | Jeong | ..................... H02M 3/073 327/535 |
| 6,448,818 B1 | * | 9/2002 | Fletcher | .................. G06F 7/506 326/114 |
| 8,139,330 B2 | * | 3/2012 | Ishii | .................... H01L 27/0251 361/56 |
| 8,654,600 B1 | * | 2/2014 | Pollachek | ................ G11C 7/06 365/189.09 |

(Continued)

FOREIGN PATENT DOCUMENTS

| | | |
|---|---|---|
| JP | 11-331443 | 11/1999 |
| JP | 11-331443 A | 11/1999 |

(Continued)

OTHER PUBLICATIONS

PCT Appln. No. PCT/US2014/071275 International Search Report and Written Opinion, Mar. 27, 2015, 2015, 9 pgs.

(Continued)

*Primary Examiner* — Dharti Patel
(74) *Attorney, Agent, or Firm* — Blakely, Sokoloff, Taylor & Zafman LLP

(57) ABSTRACT

Described is an apparatus which comprises a pass-gate; and a control unit to control gate terminal of the pass-gate according to first availability of first or second power supplies, the control unit including: a voltage detector to detect the second power supply; and a supply switching circuit to generate a local supply for controlling the gate terminal of the pass-gate according to an output of the voltage detector.

18 Claims, 6 Drawing Sheets

(56) References Cited

U.S. PATENT DOCUMENTS

| | | | | |
|---|---|---|---|---|
| 2002/0109486 | A1* | 8/2002 | Tange | H02J 7/0031 320/162 |
| 2004/0178844 | A1* | 9/2004 | Kuramori | G05F 3/242 327/543 |
| 2006/0201730 | A1* | 9/2006 | Kaneko | B60L 11/12 180/243 |
| 2006/0244687 | A1* | 11/2006 | Fish | G09G 3/3233 345/76 |
| 2007/0057073 | A1* | 3/2007 | Mamba | G06F 1/26 235/492 |
| 2007/0096797 | A1 | 5/2007 | Camara et al. | |
| 2009/0085535 | A1* | 4/2009 | Wei | H02M 3/156 323/272 |
| 2009/0207544 | A1 | 8/2009 | Boyko et al. | |
| 2010/0271742 | A1* | 10/2010 | Shannon | G01R 31/002 361/56 |
| 2012/0201062 | A1* | 8/2012 | Lee | H02J 9/005 363/84 |
| 2013/0328533 | A1 | 12/2013 | Idgunji et al. | |
| 2014/0167821 | A1* | 6/2014 | Yang | H03F 3/45197 327/108 |
| 2014/0355157 | A1* | 12/2014 | Huang | H02H 9/046 361/56 |
| 2015/0171839 | A1* | 6/2015 | Bichan | H03K 3/013 331/57 |
| 2015/0236592 | A1* | 8/2015 | Inoue | H02M 3/158 318/445 |

FOREIGN PATENT DOCUMENTS

| | | |
|---|---|---|
| JP | 2001-345687 | 12/2001 |
| JP | 2001-345687 A | 12/2001 |

OTHER PUBLICATIONS

PCT Notification of Transmittal of the International Search Report and the Written Opinion for PCT Counterpart Application No. PCT/US2014/071275, 9 pgs., (Mar. 27, 2015).

* cited by examiner

LOW POWER CIRCUIT FOR TRANSISTOR ELECTRICAL OVERSTRESS PROTECTION IN HIGH VOLTAGE APPLICATIONS

BACKGROUND

To keep up with Moore's Law, transistor channel length and gate-oxide thickness scaling is pursued from process node to process node in CMOS technology. Aggressive scaling of the gate oxide thickness for higher transistor current and speed has intensified reliability issues related to silicon dioxide ($SiO_2$) that is used as gate oxide. Due to scaling, electric field within the gate oxide grows larger which may cause breakdown of the gate oxide. In deep sub-micron silicon process nodes, like 45 nm, 32 nm, and other advanced process nodes, the transistor gate-oxide and junction voltage limit have reduced and there are more voltage design rules to follow to prevent gate-oxide breakdown resulting from electrical overstress (EOS). This is because of thinner gate-oxide and shorter channel length for the transistors.

To support higher voltage applications, thick gate-oxide transistors may be used. If there are different high voltage sources (e.g., 1.8V, 3.3V, etc.) for the chip, then different types of thick-gate transistors may be used for various speed requirements. For example, for circuits desiring higher speed thinner gate-oxide transistors may be used compared to circuits desiring lower speed. Having many flavors of transistors with different gate-oxide thicknesses in a particular process node is costly due to extra mask cost, yield, and reliability challenges in fabrication. To reduce this cost, circuits are designed to enable the usage of transistors to support voltage higher than its limit.

Usually, sensitive components in electronic systems and circuits in chips are protected from EOS in a number of ways. For example, a circuit is used to generate an intermediate-level voltage (e.g., 1.8V) to provide protection to transistors when a higher power supply (e.g., 3.3V) ramps up before a lower power supply (e.g., 1.8V). Intermediate-level voltage may be used to prevent any transistor junction from exceeding the breakdown voltage limit when the higher power supply (e.g., 3.3V) is powered up first followed by powering up of the lower power supply (e.g., 1.8V). One common way to generate this intermediate-level voltage is to use a step-down voltage regulator.

However, voltage regulators consume high power and may not be suitable for low power applications. Also, voltage regulators consume idle power to step down a higher power supply (e.g., 3.3V) to lower power supply (e.g., 1.8V) when the lower power supply is ramped down while the higher power supply continues to be supplied to the chip. Furthermore, voltage regulators may need EOS protection to prevent its transistors from exposure of higher power supply (e.g., 3.3V).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
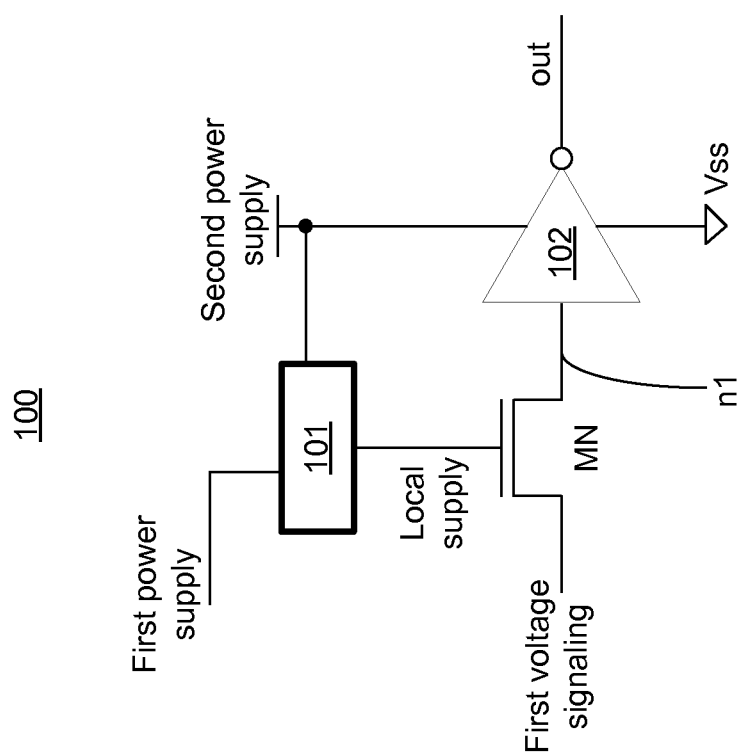
FIG. 1 illustrates an apparatus with electrical overstress (EOS) protection, according to one embodiment of the disclosure.

The embodiments describe circuits to enable the usage of transistor to support operation with voltage higher than the transistor's limit. In one embodiment, the circuit comprises a low-power Voltage Detector and a Supply Switching Circuit, to achieve EOS (electrical overstress) protection for transistors used in high-voltage applications. For the purpose of explaining the embodiments of the disclosure, a 1.8V-transistor is used for both 1.8V and 3.3V applications. However, the embodiments are not limited to this scenario. For example, the embodiments can also be used in the scenario when 1.0V thin-gate transistor is used to support both 1.0V and 1.8V applications, and so on.

In one embodiment, 1.8V thick-gate transistor can be used in circuits to support both 1.8V and 3.3V applications. By doing this, the type of transistors on a chip can be reduced, thus it may reduce production cost because the process node does not have to support special transistors to support the higher voltage (e.g., 3.3V) applications. In this context, a variant of voltage suppression mechanism can be applied. This can be achieved by having internal biasing voltage to protect certain transistor terminals inside a circuit such that every transistor gate oxide or junction is not exposed to voltage higher than its reliability limit. On the other hand, if 3.3V-transistor were used to support a 1.8V application, it may not be able to meet the speed requirement since thicker gate-oxides usually trade off with slower speed.

In one embodiment, an apparatus for EOS protection is described which comprises: a pass-gate; and a control unit to control gate terminal of the pass-gate according to first availability of first or second power supplies. In one embodiment, the first power supply (e.g., 3.3V) is higher than the second power supply (e.g., 1.8V). In one embodiment, the control unit includes: a voltage detector to detect the second power supply; and a supply switching circuit to generate a local supply for controlling the gate terminal of the pass-gate according to an output of the voltage detector. In this embodiment, the local supply has a voltage level which ensures that the pass-gate and subsequent circuits coupled to it are protected from EOS. In one embodiment, transistors that operate using the lower power supply are used for providing EOS protection. One technical effect of using such transistors is that the process node can save costs by not fabricating higher voltage tolerant transistors to provide EOS protection.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors, Gate All Around Cylindrical Transistors or other devices implementing transistor functionality like carbon nanotubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates an apparatus 100 with EOS protection, according to one embodiment of the disclosure. In one embodiment, apparatus 100 comprises a pass-gate MN, EOS protection circuit 101, and driver 102.

In one embodiment, pass-gate MN receives first voltage signaling (e.g., 3.3V signal) and provides it to driver 102 via node n1 according to voltage on its gate terminal. In one embodiment, gate terminal of pass-gate MN is controlled by Local supply generated by EOS protection circuit 101 (also referred to as the control unit). While the embodiment is illustrated with an n-type pass-gate MN, the pass-gate can be replaced with a p-type pass-gate, or a combination of both n-type and p-type pass-gates.

In one embodiment, EOS protection circuit 101 receives first power supply (e.g., 3.3V) and second power supply (e.g., 1.8V) and generates Local supply such that pass-gate MN is protected from EOS. In one embodiment, EOS protection circuit 101 comprises a voltage detector and a supply switching circuit. In this embodiment, the voltage detector detects the second power supply (e.g., 1.8V). If the second power supply is below a predetermined threshold or is simply not available, then EOS protection circuit 100 makes sure that Local supply causes pass-gate MN to turn OFF to protect pass-gate MN and subsequent circuits (i.e., driver 102) from EOS caused by the first power supply (e.g., 3.3V). In one embodiment, driver 102 is a Universal Serial Bus (USB) compliant driver (e.g., USB2, USB3, etc.). In other embodiments, driver 102 is compliant to other standards. For example, driver 102 is compliant with other serial I/O standards (e.g., PCIe) that involve high voltage (i.e., more that 1V). PCIe refers to Peripheral Component Interconnect Express. In one embodiment, driver 102 is powered by second power supply and generates an output "out" which is transmitted over a transmission line to a receiver.

Figure 2:
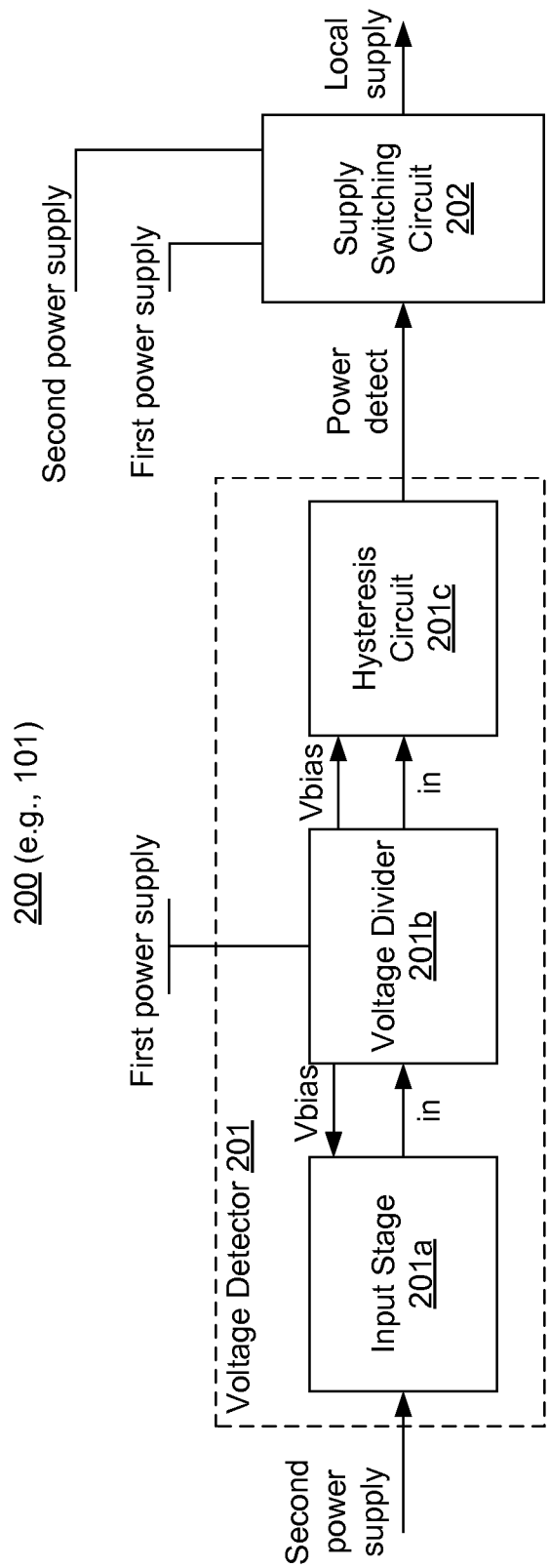
FIG. 2 illustrates an EOS protection circuit having a voltage detector and a supply switching circuit, according to one embodiment of the disclosure.

FIG. 2 illustrates an EOS protection circuit 200 (e.g., 101) having a voltage detector and a supply switching circuit, according to one embodiment of the disclosure. It is pointed out that those elements of FIG. 2 having the same reference numbers (or names) as the elements of any other figure can operate or function in any manner similar to that described, but are not limited to such.

In one embodiment, EOS protection circuit 200 comprises Voltage Detector 201 and Supply Switching Circuit 202. In one embodiment, Voltage Detector 201 comprises Input Stage 201a, Voltage Divider 201b, and Hysteresis Circuit 201c. In one embodiment, Input Stage 201a receives Second power supply (e.g., 1.8V) and provides it as signal "in" to Voltage Divider 201b. In one embodiment, Voltage Divider 201b receives First power supply (e.g., 3.3V) and generates a divided down version of First power supply as Vbias. In one embodiment, Vbias is used to control a gate terminal of Input Stage 201a so that Input Stage 201a is protected from EOS.

In one embodiment, Vbias is used to power Hysteresis Circuit 201c. In one embodiment, Hysteresis Circuit 201c receives input signal "in" and generates Power detect signal indicating whether Second power supply is above or below a predetermined threshold. In one embodiment, Hysteresis Circuit 201c is a Schmitt Trigger device. In other embodiments, other type of hysteresis circuits may be used for Hysteresis Circuit 201c. In one embodiment, Power detect is received as input to Supply Switching Circuit 202 which generates Local supply according to the Power detect signal.

In this embodiment, Voltage Detector 201 is self-biased with First power supply (e.g., 3.3V power supply) and itself is free of EOS by ensuring that voltages across all transistor junctions, such as gate-source, gate-drain, etc. are within the reliability specifications. In one embodiment, Voltage Detector 201 is used to detect the Second power supply (e.g., 1.8V supply) when it is powered with the First power supply (e.g., 3.3V supply). In such an embodiment, Power detect (i.e., output of Voltage Detector 201) is then used to switch the Supply Switching Circuit between biasing voltage generated internally from Voltage Divider 201 and the external power supply (i.e., First power supply). In one example, EOS circuit 200 consumes substantially zero idle power if there is no transistor leakage.

Figure 3:
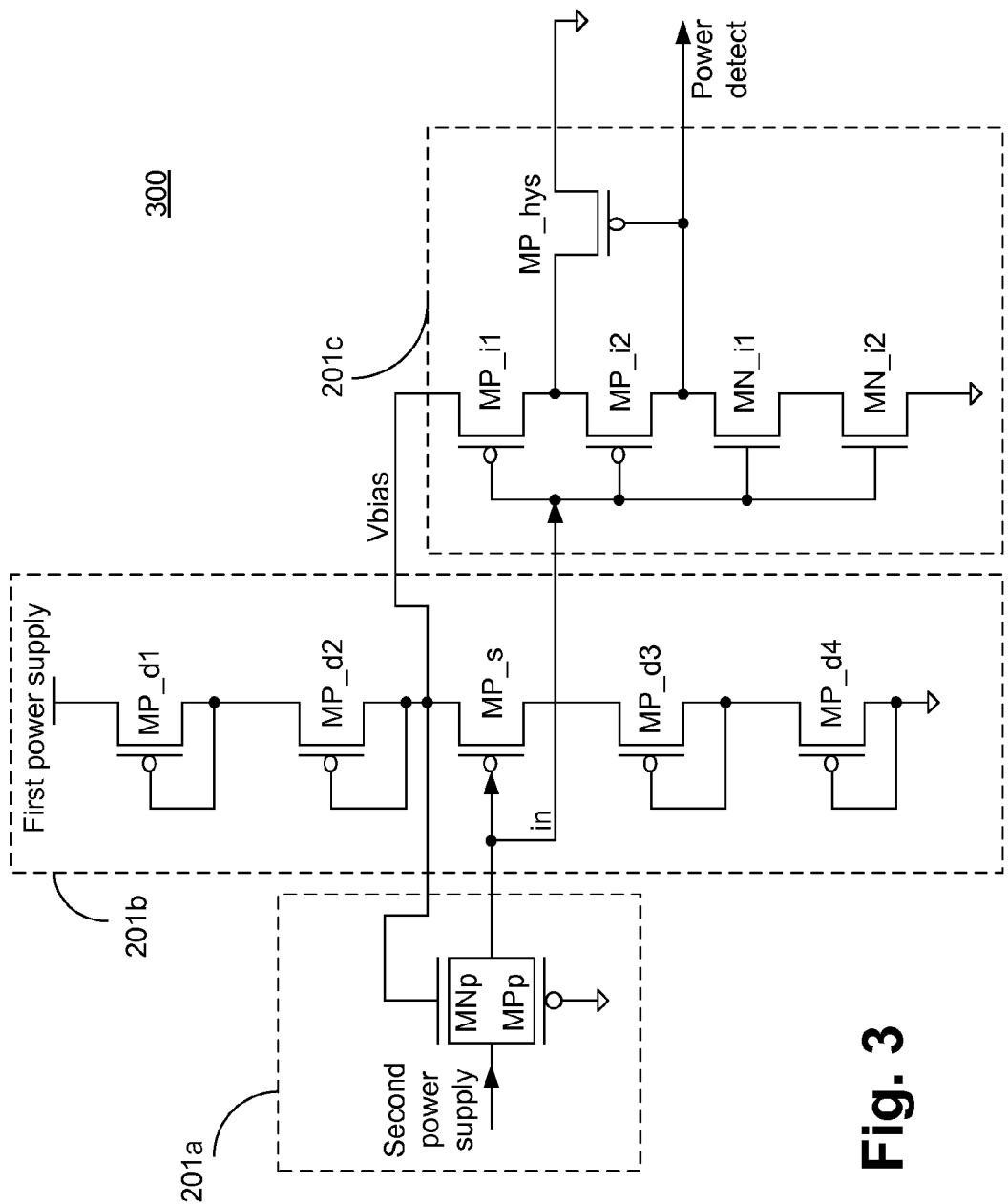
FIG. 3 illustrates a circuit implementation of a voltage detector, according to one embodiment of the disclosure.

FIG. 3 illustrates a circuit 300 implementation of a voltage detector (e.g., Voltage Detector 201), according to one embodiment of the disclosure. It is pointed out that those elements of FIG. 3 having the same reference numbers (or names) as the elements of any other figure can operate or function in any manner similar to that described, but are not limited to such.

In one embodiment, Input stage 201a comprises a transmission gate having n-type transistor MNp and p-type transistor MPp coupled together in parallel. In one embodiment, gate terminal of MPp is coupled to ground (or Vss) and is always turned ON. In one embodiment, gate terminal of MNp is controlled by Vbias generated by Voltage Divider 201b. In one embodiment, Second power supply is received at one end of transmission gate while signal "in" is provided as output at another end of transmission gate.

In one embodiment, Voltage Divider 201b comprises diode connected p-type devices Mp_d1, MP_d2, MP_d3, and MPd4; and p-type switch MP_s. In this embodiment, five transistors are shown coupled together in series such that switch MP_s is in the middle of the series of transistors, where MP_d1 is coupled to the First power supply (e.g., 3.3V) and MP_d4 is coupled to ground. While the embodiments are explained with reference to four diode connected devices, any number of diode connected devices may be used. In one embodiment, signal "in" from Input stage 201a is used to control the gate terminal of MP_s. In one embodiment, source terminal of MP_s is Vbias which is coupled to gate terminal of MNp and source terminal of MP_i1. Here, names for signals and nodes are interchangeably used. For example, Vbias is used to indicate Vbias signal or Vbias node depending on the context of the sentence.

In one embodiment, Hysteresis Circuit 201c comprises p-type devices MP_i1, MP_i2, and MP_hys; and n-type devices MN_i1 and MN_i2. In one embodiment, MP_i1, MP_i2, MN_i1, and MN_i2 are coupled together in series such that source terminal of MP_i1 is coupled to Vbias and the source terminal of MN_i2 is coupled to ground. In one embodiment, gate terminals of MP_i1, MP_i2, MN_i1, and MN_i2 are coupled together to receive input signal "in." In one embodiment, drain terminals of MP_i2 and MN_i1 provide the output, Power detect. In one embodiment, Power detect is used to control the gate terminal of MP_hys. In one embodiment, source terminal of MP_hys is coupled to source terminal of MPi2 and drain terminal of MP_i1. In one embodiment, drain terminal of MP_hys is coupled ground.

In one embodiment, Second power supply (e.g., external 1.8V supply) is connected to the input of Voltage Detector 300 through pass-gate. The technical effect of the pass-gate is that it provides reliability protection to the transistor of the voltage divider 201b. In one embodiment, the Input stage 201a may be removed. In one embodiment, when the First power supply (e.g., external supply 1.8V) is OFF (i.e., approximately 0V), Voltage Divider 201b is turned ON through MP_s. In such an embodiment, MP_s produces Vbias which is substantially close in value to the Second power supply (e.g., 1.5V to 1.8V). In one embodiment, Vbias establishes a stable trip point (i.e., predetermined threshold) for Voltage Detector 300. In one embodiment, the trip point is within a certain range to ensure that Supply Switching Circuit 202 does not switch too early to external Second power supply while the external Second power supply is still ramping up and the voltage level is still low to prevent EOS. In one embodiment, the p-n ratio of MP_i1 (and MP_i2) and MN_i1 (and MN_i2) may also affect the trip point.

In one embodiment, MP_hys not only produces hysteresis for Voltage Detector 300 to be more immune to input noise, but MP_hys also ensures that the output Power detect can be pulled to 0V when external Second power supply (e.g., 1.8V) is ramped up. One reason for this is that when external Second power supply (e.g., 1.8V) supply is ramped up, Voltage Divider 201b is shut OFF through MP_s to save power. In such an embodiment, Vbias may float high but raises no EOS concern and MP_i1 and MP_i2 may not be shut OFF completely. This is because when Second power supply (e.g., 1.8V) is ramped up, the gates of MP_s, MP_i1 and MP_i2 are at a 1.8V. In such an embodiment, even though Vbias floats high (i.e., more than 1.8V), the potential across transistor gate-source is still within the 1.8V limit. In one embodiment, MP_hys is turned ON when Power detect goes low, and assists in pulling the Power detect to low, providing positive feedback for switching to 0V.

In one embodiment, when the external Second power supply (e.g., 1.8V) is completely ramped up, Voltage Divider 201b is shut OFF through MP_s and the Power detect is 0V. In this embodiment, no idle current is consumed, except for any leakage current. In one embodiment, when Power detect is 0V, the internally generated voltage is switched OFF, whereas the external Second power supply (e.g., 1.8V supply) is switched ON in Supply Switching Circuit 202.

In one embodiment, when external Second power supply (e.g., 1.8V supply) is ramped down (e.g., ramped to 0V), Voltage Divider 201b is switched ON again through MP_s (i.e., gate of MP_s is 0V) to generate Vbias for Voltage Detector 300. In such an embodiment, Power detect goes high (same voltage level as Vbias) to switch Supply Switching Circuit 202 from external Second power supply (e.g., 1.8V) to internally generated voltage to prevent any transistor gate or junction from experiencing voltage more than its EOS limit.

Figure 4:
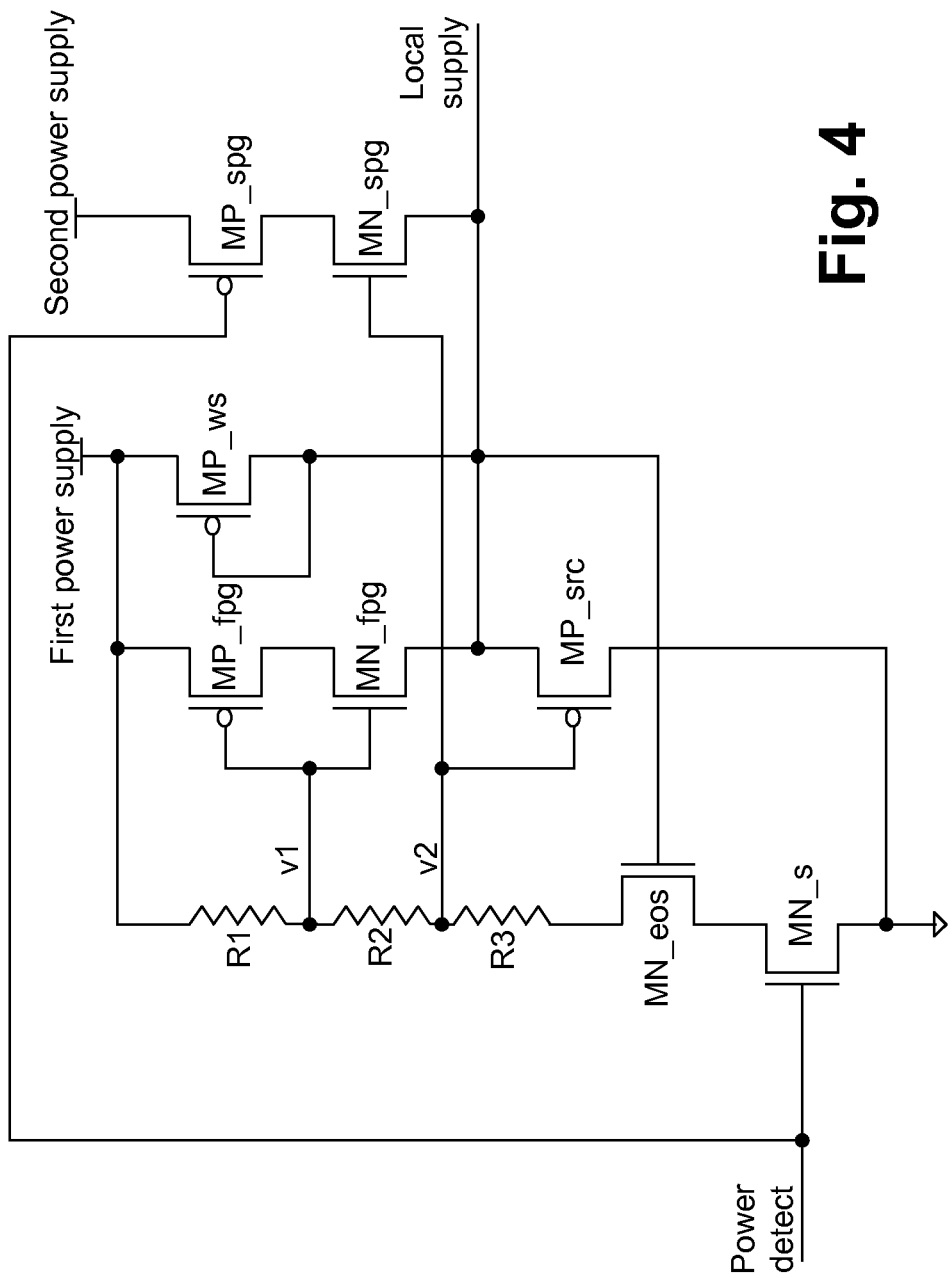
FIG. 4 illustrates a circuit implementation of a supply switching circuit, according to one embodiment of the disclosure.

FIG. 4 illustrates a circuit 400 implementation of a supply switching circuit (e.g., Supply Switching Circuit 202), according to one embodiment of the disclosure. It is pointed out that those elements of FIG. 4 having the same reference numbers (or names) as the elements of any other figure can operate or function in any manner similar to that described, but are not limited to such.

In one embodiment, circuit 400 comprises a first circuit operating on the First power supply (e.g., 3.3V) and a second circuit operating on the Second power supply (e.g., 1.8V). In one embodiment, the first circuit comprises a voltage divider that provides divided voltages v1 and v2 from the First power supply. In one embodiment, the voltage divider is formed using series coupled resistors R1, R2, and R3. In one embodiment, resistors R1, R2, and R3 are implemented as precision resistors (e.g., CPR). In one embodiment, resistors R1, R2, and R3 are implemented as transistors operating in linear region. In one embodiment, resistances of resistors R1, R2, and R3 are programmable, for example, by digital signal or fuses.

While the embodiment is explained with reference to three resistors, fewer or more resistors may be used. In one embodiment, resistors are replaced with diode connected p-type devices. In one embodiment, the voltage divider is coupled to an n-type switch MN_s which receives Power detect signal from Voltage Detector 201. In one embodiment, MN_s is used to turn ON the first circuit and turn OFF the second circuit, and visa versa. In one embodiment, an EOS protection n-type device is also coupled in series with MN_s and the voltage divider as shown. In such an embodiment, the gate terminal of MN_eos is controlled by Local supply.

In one embodiment, the first circuit comprises a p-type power gate MP_fpg with its gate terminal coupled to v1 and source terminal coupled to the First power supply. In one embodiment, the first circuit is a switch for higher voltage source i.e., First power supply (e.g., 3.3V in this example). In one embodiment, the first circuit comprises an n-type power gate MN_fpg with its gate terminal coupled to v1 and source terminal coupled to Local supply while the drain terminal coupled to the drain terminal of MP_fpg. In one embodiment, the first circuit comprises a source follower MP_src with its gate terminal coupled to v2, source terminal coupled to Local supply and drain terminal coupled to ground.

In one embodiment, the second circuit comprises a p-type power gate MP_spg with its gate terminal coupled to Power detect signal from Voltage Detector 201. The second circuit is a switch for the Second power supply (e.g., external voltage source 1.8V). In one embodiment, the second circuit comprises an n-type power gate MN_spg with its gate terminal coupled to v2, source terminal coupled to Local supply, and drain terminal coupled to MP_spg. Here, labels for nodes and signals are interchangeably used. For example, v2 is used to refer to node v2 or signal v2 depending on the context of the sentence.

In one embodiment, circuit 400 (i.e., Supply Switching Circuit) is used to switch between internally-generated low power supply (e.g., 1.8V which is a stepped down version of 3.3V) and Second power supply (e.g., external 1.8V power supply) when the Second power supply is switched ON. In this example, the internally-generated voltage level is established by MN_fpg with a value around v1-Vth of n-type transistor. In one embodiment, MN_s is used to shut OFF the voltage divider branch of the first circuit, by Power detect signal, when it is not needed to save on idle power.

In one embodiment, MN_eos is used to protect MN_s from exposure to First power supply (e.g., 3.3V) Gate-Drain voltage when MN_s is switched OFF (e.g., 0V at its gate). In one embodiment, with the gate terminal of MN_eos biased at approximately the Second power supply level (e.g., 1.8V), the voltage at the drain of MN_s may not exceed the Second power supply level. In one embodiment, MP_fpg is used as a power gate to switch ON or OFF the supply from First power supply (e.g., 3.3V) while MN_fpg is an NMOS source-follower used to generate the Local supply voltage at potential around the Second power supply (e.g., 1.8V). In one embodiment, the weak diode-connected PMOS MP_ws is a weak leaker to kick-start circuit 400 when the First power supply (e.g., 3.3V) is ramped up. This prevents the gate of MN_eos from being stuck at 0V during start-up which may cause EOS to circuit 400.

In one embodiment, MP_spg of the second circuit is used as power gate for the Second power supply (e.g., 1.8V power supply). In one embodiment, when output (i.e., Power detect) from Voltage Detector 201 is high (e.g., when Second power supply is OFF or not ramped up yet), MP_spg is switched OFF, and vice versa. In one embodiment, MN_spg is added to prevent back-power from Second power supply to the first power supply when the first power supply is shut-down. In one embodiment, when the Second power supply is 0V, the gate terminal of MN_spg is 0V and it is switched OFF.

Referring back to FIG. 2 with reference to FIG. 3 and FIG. 4, there are many advantages of EOS protection circuit 200. For example, circuit 200 has a mechanism built in the circuit for detecting presence of external Second power supply (e.g., 1.8V supply) to shut OFF the branch generating the internal voltage Vbias from the First power supply (e.g., 3.3V). This enables power saving during idle mode and when all the power is UP and no EOS condition exists. This is advantageous if compared to existing circuits which do not have voltage detection mechanism to shut OFF biasing. While the embodiments are explained with reference to 1.8V-transistor used for 3.3V high-voltage application, circuit 200 can be customized to support other usage models with tweaking of the output voltage level, such as 1.0V-transistor used for 1.8V application or 3.3V-transistor used for 5.0V application.

The EOS protection mechanism of circuit 200 allows fewer types of transistors to be used in supporting different voltage levels to meet I/O (input-output) standard requirements (e.g., USB standard). The reduction in number of transistor types translates to mask cost saving. For example, 1.8V thick-gate transistor can be used to support both 1.8V and 3.3V application. Circuit 200 is digital in nature, easy for migration from process to process.

Figure 5:
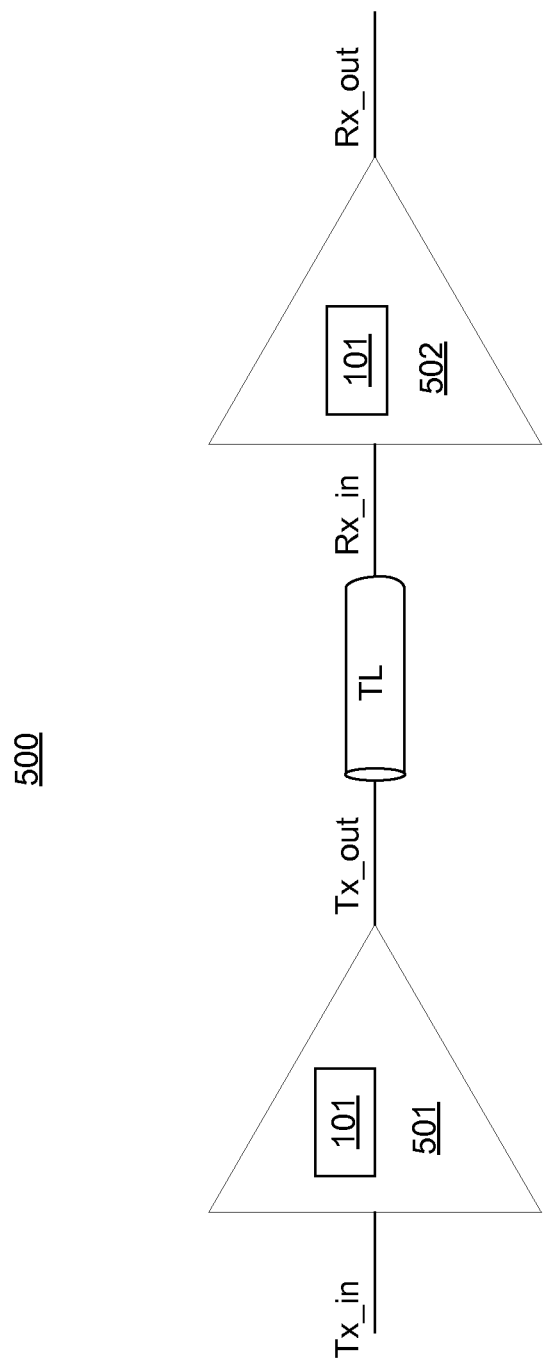
FIG. 5 illustrates a transmitter and a receiver having the apparatus of FIG. 1, according to one embodiment of the disclosure.

FIG. 5 illustrates a system 500 with a transmitter and a receiver having the apparatus of FIG. 1, according to one embodiment of the disclosure. It is pointed out that those elements of FIG. 5 having the same reference numbers (or names) as the elements of any other figure can operate or function in any manner similar to that described, but are not limited to such.

In one embodiment, system 500 comprises a transmitter 501 which is operable to communicate with a receiver 502 through a transmission line TL. In one embodiment, one or both of the transmitter 501 or receiver 502 have the EOS protection circuit 101 (e.g., 200, which is described in FIG. 3 and FIG. 4). In one embodiment, transmitter 501 receives transmitter input signal Tx_in and generates output Tx_out which is provided to receiver 502. In one embodiment, receiver 502 receives input Rx_in which then interprets the input signal Rx_in and generates an output Rx_out.

Figure 6:
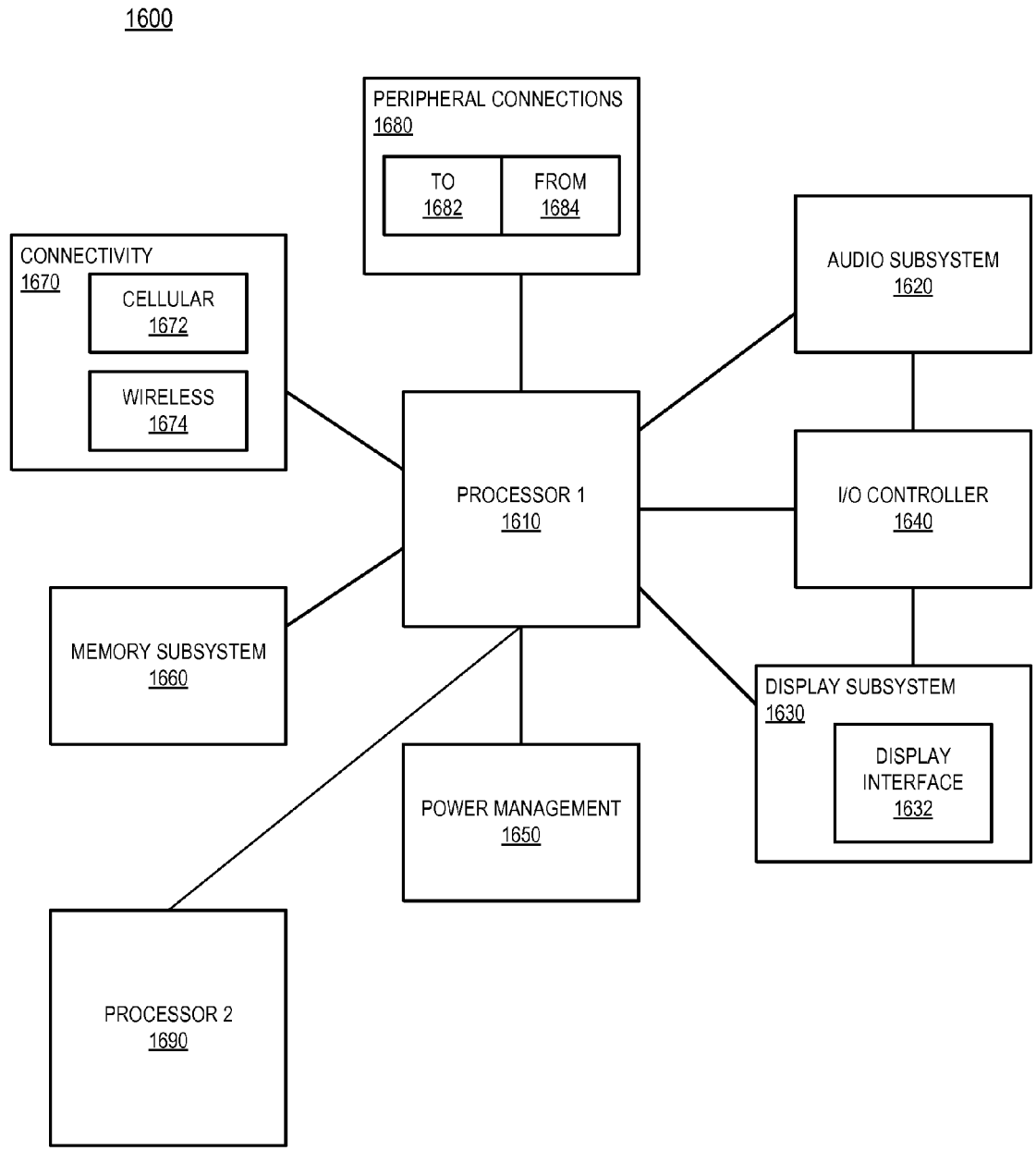
FIG. 6 is a smart device or a computer system or an SoC (System-on-Chip) with apparatus with EOS protection, according to one embodiment of the disclosure.

FIG. 6 is a smart device or a computer system or an SoC (System-on-Chip) with apparatus with EOS protection, according to one embodiment of the disclosure. It is pointed out that those elements of FIG. 6 having the same reference numbers (or names) as the elements of any other figure can operate or function in any manner similar to that described, but are not limited to such.

FIG. 6 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with apparatus with EOS protection described with reference to embodiments. Other blocks of the computing device 1600 may also include apparatus with EOS protection described with reference to embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. Processor 1690 may be optional. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a pass-gate; and a control unit to control gate terminal of the pass-gate according to first availability of first or second power supplies, the control unit including: a voltage detector to detect the second power supply; and a supply switching circuit to generate a local supply for controlling the gate terminal of the pass-gate according to an output of the voltage detector.

In one embodiment, the voltage detector comprises an input stage to receive the second power supply, the input stage controllable by a bias voltage. In one embodiment, the voltage detector comprises a voltage divider to generate the bias voltage according to an output of the input stage and the first power supply. In one embodiment, the voltage detector comprises a hysteresis circuit to receive the output of the input stage, the hysteresis circuit to generate the output of the voltage detector. In one embodiment, the hysteresis circuit comprises a Schmitt Triggered device. In one embodiment, the hysteresis circuit is powered by the bias voltage.

In one embodiment, the voltage divider comprises a plurality of diode connected devices. In one embodiment, the voltage divider comprises a switch to receive an output of the input stage. In one embodiment, the supply switching circuit comprises: a first circuit powered by the first power supply; and a second circuit powered by a second power supply, wherein an output of the voltage detector to enable one of the first or second circuits. In one embodiment, the first power supply is higher than the second power supply. In one embodiment, the pass-gate is operable to protect a driver from electrical over stress.

In another example, a system is provided which comprises a memory unit; and a processor coupled to the memory unit, the processor to receive one of first or second power supplies, the processor having an electrical overstress protection circuit according to the apparatus discussed above. In one embodiment, the system further comprises: a wireless interface for allowing the processor to communicate with another device. In one embodiment, the system further comprises: a display unit. In one embodiment, the display unit is a touch screen.

In another example, an apparatus is provided which comprises: a first power supply; a second power supply, the second power supply being lower than the first power supply; a voltage detector to detect the second power supply; and a supply switching circuit coupled to the first and second power supplies, the supply switching circuit to generate a local supply for providing electrical overstress protection to another circuit according to an output of the voltage detector.

In one embodiment, the voltage detector comprises: an input stage to receive the second power supply, the input stage controllable by a bias voltage; a voltage divider to generate the bias voltage according to an output of the input stage and the first power supply; and a hysteresis circuit to receive the output of the input stage, the hysteresis circuit to generate the output of the voltage detector. In one embodiment, the hysteresis circuit comprises a Schmitt Triggered device, and wherein the hysteresis circuit is powered by the bias voltage. In one embodiment, the supply switching circuit comprises: a first circuit powered by the first power supply; and a second circuit powered by a second power supply, wherein an output of the voltage detector to enable one of the first or second circuits.

In another example, a system is provided which comprises a memory unit; and a processor having an electrical overstress protection circuit according to the apparatus discussed above. In one embodiment, the system further comprises: a wireless interface for allowing the processor to communicate with another device. In one embodiment, the system further comprises: a display unit. In one embodiment, the display unit is a touch screen.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An apparatus comprising:
   a pass-gate; and
   a control unit to control a gate terminal of the pass-gate according to a first availability of first or second power supplies, the control unit including:
      a voltage detector to detect the second power supply; and
      a supply switching circuit to generate a local supply for controlling the gate terminal of the pass-gate according to an output of the voltage detector, wherein the voltage detector comprises
         an input stage to receive the second power supply, the input stage controllable by a bias voltage, and
         a voltage divider to generate the bias voltage according to an output of the input stage and the first power supply.

2. The apparatus of claim 1, wherein the voltage detector comprises a hysteresis circuit to receive the output of the input stage, the hysteresis circuit to generate the output of the voltage detector.

3. The apparatus of claim 2, wherein the hysteresis circuit comprises a Schmitt Triggered device.

4. The apparatus of claim 2, wherein the hysteresis circuit is powered by the bias voltage.

5. The apparatus of claim 1, wherein the voltage divider comprises a plurality of diode connected devices.

6. The apparatus of claim 5, wherein the voltage divider comprises a switch to receive an output of the input stage.

7. The apparatus of claim 1, wherein the supply switching circuit comprises:
   a first circuit powered by the first power supply; and
   a second circuit powered by a second power supply, wherein an output of the voltage detector to enable one of the first or second circuits.

8. The apparatus of claim 1, wherein the first power supply is higher than the second power supply.

9. The apparatus of claim 1, wherein the pass-gate is operable to protect a driver from electrical over stress.

10. An apparatus comprising:
    a first power supply;
    a second power supply, the second power supply being lower than the first power supply;
    a voltage detector to detect the second power supply; and
    a supply switching circuit coupled to the first and second power supplies, the supply switching circuit to generate a local supply for providing electrical overstress protection to another circuit according to an output of the voltage detector, wherein the voltage detector comprises
       an input stage to receive the second power supply, the input stage controllable by a bias voltage; and
       a voltage divider to generate the bias voltage according to an output of the input stage and the first power supply.

11. The apparatus of claim 10, wherein the voltage detector comprises:
    a hysteresis circuit to receive the output of the input stage, the hysteresis circuit to generate the output of the voltage detector.

12. The apparatus of claim 11, wherein the hysteresis circuit comprises a Schmitt Triggered device, and wherein the hysteresis circuit is powered by the bias voltage.

13. The apparatus of claim 10, wherein the supply switching circuit comprises:
    a first circuit powered by the first power supply; and
    a second circuit powered by a second power supply, wherein an output of the voltage detector to enable one of the first or second circuits.

14. A system comprising:
    a memory unit;
    a processor coupled to the memory unit, the processor to receive one of first or second power supplies, the processor having an electrical overstress protection circuit comprising:
       a voltage detector to detect the second power supply; and
       a supply switching circuit coupled to the first and second power supplies, the supply switching circuit to generate a local supply for providing electrical overstress protection to another circuit according to an output of the voltage detector, wherein the voltage detector comprises
          an input stage to receive the second power supply, the input stage controllable by a bias voltage; and
          a voltage divider to generate the bias voltage according to an output of the input stage and the first power supply; and
    a wireless interface for allowing the processor to communicate with another device.

15. The system of claim 14, wherein the system comprises:
    a pass-gate controllable by the local supply; and
    a USB compliant driver having an input coupled to the pass-gate.

16. The system of claim 15 further comprises a display unit.

17. The system of claim 14, wherein the voltage detector comprises:
    a hysteresis circuit to receive the output of the input stage, the hysteresis circuit to generate the output of the voltage detector.

18. The system of claim 17, wherein the supply switching circuit comprises:
    a first circuit powered by the first power supply; and
    a second circuit powered by a second power supply, wherein an output of the voltage detector to enable one of the first or second circuits.

* * * * *